United States Patent
Yang et al.

(10) Patent No.: US 10,692,811 B1
(45) Date of Patent: Jun. 23, 2020

(54) SEMICONDUCTOR STRUCTURE

(71) Applicant: NANYA TECHNOLOGY CORPORATION, New Taipei (TW)

(72) Inventors: Tsang-Po Yang, New Taipei (TW); Shian-Jyh Lin, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/207,186

(22) Filed: Dec. 2, 2018

(51) Int. Cl.
*H01L 23/525* (2006.01)
*H01L 27/108* (2006.01)

(52) U.S. Cl.
CPC ........ *H01L 23/5252* (2013.01); *H01L 27/108* (2013.01)

(58) Field of Classification Search
CPC ............... H01L 23/5252; H01L 27/108; H01L 23/5254; H01L 27/11206; H01L 27/10817
See application file for complete search history.

(56) References Cited

U.S. PATENT DOCUMENTS

| 6,515,888 B2 | 2/2003 | Johnson et al. |
| 6,784,069 B1 * | 8/2004 | Patraw ............. H01L 21/31111 257/296 |
| 2004/0217441 A1 * | 11/2004 | Lehmann ............ H01L 23/5252 257/530 |
| 2007/0069241 A1 * | 3/2007 | Yang ..................... G11C 17/16 257/209 |

\* cited by examiner

*Primary Examiner* — Syed I Gheyas
(74) *Attorney, Agent, or Firm* — CKC & Partners Co., LLC

(57) ABSTRACT

A semiconductor structure includes a first anti-fuse structure, a second anti-fuse structure and a first metal layer. The second anti-fuse structure is disposed over the first anti-fuse structure. The first metal layer is between the first anti-fuse structure and the second anti-fuse structure. A first contact is disposed between the first anti-fuse structure and the first metal layer to connect thereof. A second contact is disposed between the second anti-fuse structure and the first metal layer to connect thereof.

12 Claims, 4 Drawing Sheets

SEMICONDUCTOR STRUCTURE

BACKGROUND

Field of Invention

The present invention relates to a semiconductor structure. More particularly, the present invention relates to a semiconductor structure with vertical anti-fuse structures.

Description of Related Art

Fuse elements are commonly used in semiconductor devices such as dynamic random access memory (DRAM). For example, fuses and anti-fuses are used to repair dynamic random access memory (DRAM) arrays by swapping defective cells with redundant cells.

Conventional fuse elements are arranged horizontally on a same surface, such that take up a plenty of horizontal area in the semiconductor device. As semiconductor devices become more highly integrated, a horizontal area of a unit cell on a semiconductor substrate may be gradually decreased. Accordingly, there is a demand for a novel structure for solving the above problems.

SUMMARY

In accordance with an aspect of the present invention, a semiconductor structure is provided. The semiconductor structure includes a first anti-fuse structure, a second anti-fuse structure over the first anti-fuse structure, and a first metal layer between the first anti-fuse structure and the second anti-fuse structure.

According to some embodiments of the present invention, a semiconductor structure includes a first anti-fuse structure, a second anti-fuse structure, and a first metal layer. The second anti-fuse structure is over the first anti-fuse structure. The first metal layer is between the first anti-fuse structure and the second anti-fuse structure.

According to some embodiments of the present invention, the first anti-fuse structure includes a semiconductor substrate, a first dielectric layer on the semiconductor substrate, and a conductive layer on the first dielectric layer.

According to some embodiments of the present invention, the semiconductor substrate has a heavily doped region in contact with the first dielectric layer.

According to some embodiments of the present invention, the conductive layer extends on a plane parallel to the semiconductor substrate.

According to some embodiments of the present invention, the second anti-fuse structure includes at least one bottom electrode, a second dielectric layer, and a top electrode. The bottom electrode has an inner portion, an outer portion surrounding the inner portion, and a junction portion under the inner portion and the outer portion. Each of the inner portion and the outer portion is a hollow columnar elongated along a longitudinal axis that is perpendicular to the plane of the first anti-fuse structure. The junction portion is connected with the inner portion and the outer portion. The second dielectric layer conformally covers the bottom electrode. The top electrode covers the second dielectric layer. The top electrode includes a first portion inserted into the bottom electrode and a second portion over the first portion.

According to some embodiments of the present invention, the inner portion and the outer portion have a generally concentric circular transverse cross section.

According to some embodiments of the present invention, the bottom electrode comprises titanium nitride.

According to some embodiments of the present invention, the second dielectric layer comprises zirconium dioxide.

According to some embodiments of the present invention, the top electrode comprises polysilicon.

According to some embodiments of the present invention, the semiconductor structure further includes a supporting structure over the bottom electrode, and the supporting structure includes nitride.

According to some embodiments of the present invention, the semiconductor structure further includes a first contact, and a second contact. The first contact is between the first anti-fuse structure and the first metal layer. The second contact is between the second anti-fuse structure and the first metal layer.

According to some embodiments of the present invention, the semiconductor structure further includes a second metal layer over the second anti-fuse structure.

According to some embodiments of the present invention, the semiconductor structure further includes a transistor coupled to the first anti-fuse structure and the second anti-fuse structure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
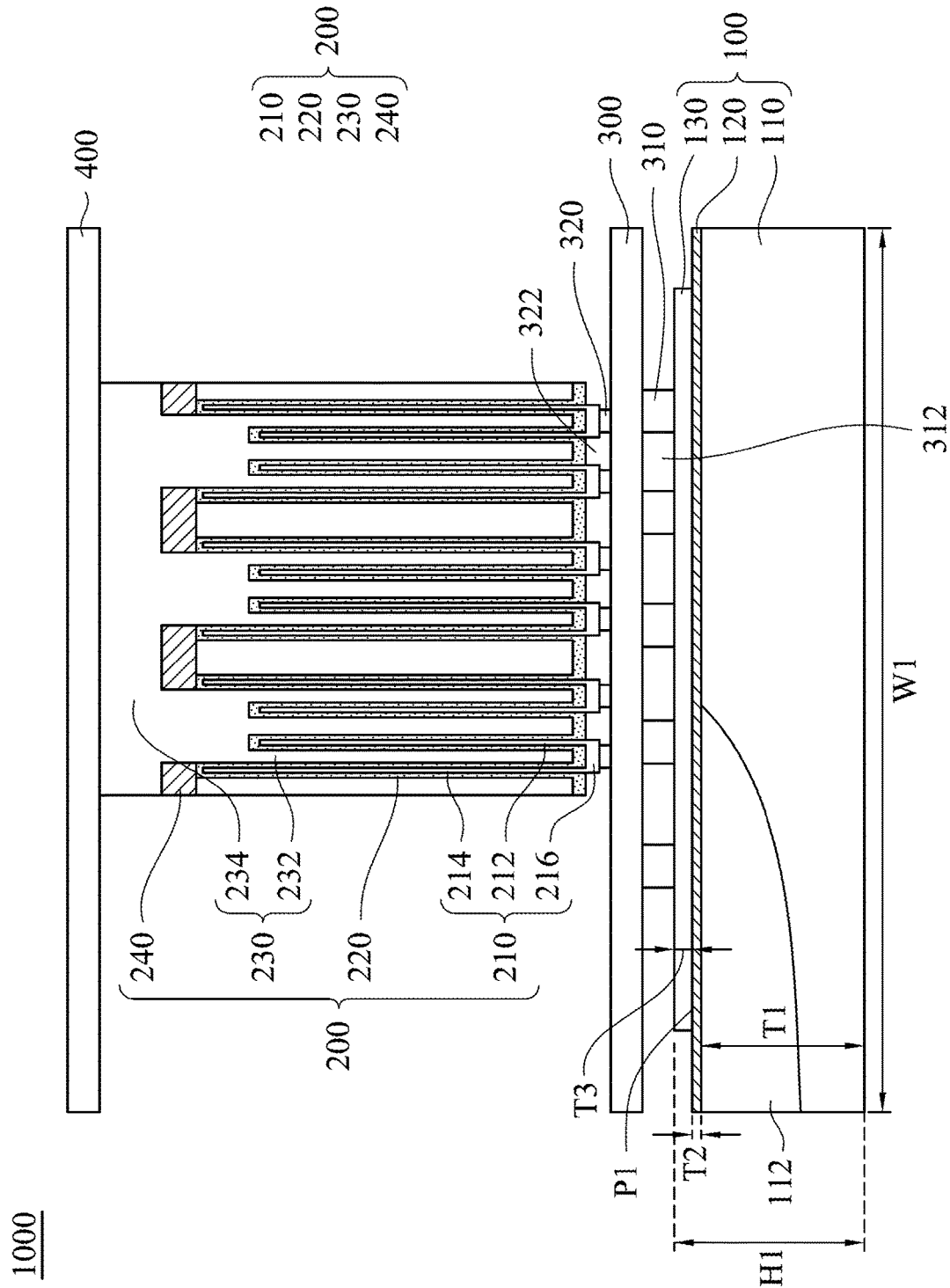
FIG. 1 is a schematic cross-sectional view of semiconductor structure in accordance with various embodiments of this invention.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a schematic cross-sectional view of semiconductor structure 1000 in accordance with various embodiments of this invention. The semiconductor structure 1000 includes a first anti-fuse structure 100, a second anti-fuse structure 200, and a first metal layer 300.

As shown in FIG. 1, the first anti-fuse structure 100 includes a semiconductor substrate 110, a first dielectric layer 120, and a conductive layer 130. In some embodiments, the semiconductor substrate 110 includes semiconductor material, such as silicon, germanium, or the likes. In some examples, the semiconductor substrate 110 may include, but not limited to, bulk semiconductor materials such as a semiconductor wafer, and semiconductor material layers. In other examples, the semiconductor substrate 110 may include various doping configurations, such as different doping profiles (e.g., n wells, p wells) may be formed on the semiconductor substrate 110 in regions designed for different device types (e.g., n-type field effect transistors (NFET), p-type field effect transistors (PFET)). As shown in FIG. 1, in some embodiments, the semiconductor substrate 110 has a heavily doped region 112 in contact with the first dielectric layer 120. In some examples, the heavily doped region 112 may be source/drain region of a transistor (shown in FIG. 4). In some embodiments, the semiconductor substrate 110 may further includes an active region (not shown) therein, and the active region is coupled to the first anti-fuse structure 100. In some embodiments, the semiconductor substrate 110 may further includes isolation regions (not shown) to isolated the active region(s).

The first dielectric layer 120 is over the semiconductor substrate 110. In some embodiments, the first dielectric layer 120 includes, but not limited to, oxide materials. As shown in FIG. 1, the semiconductor substrate 110 has a thickness T1, and the first dielectric layer 120 has a thickness T2. In some embodiments, the thickness T2 of the first dielectric layer 120 is less than the thickness T1 of the semiconductor substrate 110.

The conductive layer 130 is on the first dielectric layer 120. In some embodiments, the conductive layer 130 includes, but not limited to, polysilicon. In some embodiments, the conductive layer 130 extends on a plane P1 parallel to a principle surface of the semiconductor substrate 110. As shown in FIG. 1, the conductive layer 130 has a thickness T3. In some embodiments, the thickness T3 of the conductive layer 130 is greater than the thickness T2 of the first dielectric layer 120. The first anti-fuse structure 100 with a thinner first dielectric layer 120 may be more easily to be blown.

The second anti-fuse structure 200 is disposed over the first anti-fuse structure 100. The second anti-fuse structure 200 includes one or more bottom electrodes 210, a second dielectric layer 220, and a top electrode 230. The detail of the second anti-fuse structure 200 can be referred to FIG. 2.

Figure 2:
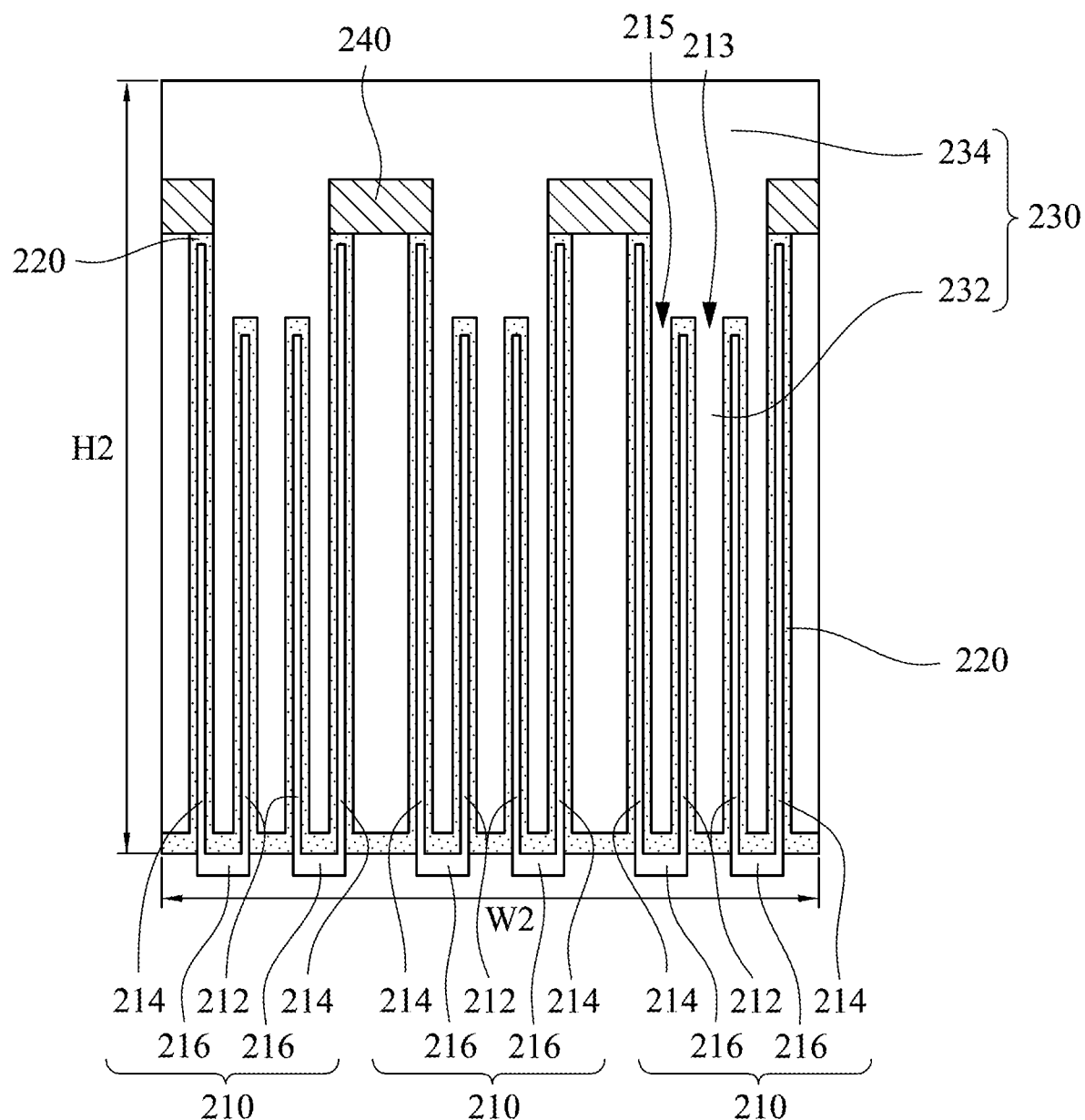
FIG. 2 is a schematic cross-sectional view of second anti-fuse structure in accordance with various embodiments of this invention.

FIG. 2 is a schematic cross-sectional view of second anti-fuse structure 200 in accordance with various embodiments of this invention. In some embodiments, the second anti-fuse structure 200 may include a plurality of bottom electrodes 210. In some embodiments, each bottom electrode 210 has an inner portion 212, an outer portion 214 surrounding the inner portion 212, and a junction portion 216 under the inner portion 212 and the outer portion 214. Specifically, each of the inner portions 212 and the outer portions 214 is a hollow columnar elongated along a longitudinal axis that is perpendicular to the plane P1 (shown in FIG. 1) of the first anti-fuse structure 100. In some embodiments, each of the inner portions 212 and the outer portions 214 may be a hollow cylinder. More specifically, each bottom electrode 210 may further include a first trench 213 in the inner portion 212 and a second trench 215 between the inner portion 212 and the outer portion 214. As illustrated in FIG. 2, the junction portion 216 connects the inner portion 212 and the outer portion 214. In some examples, the junction portion 216 may also be a hollow cylinder interconnecting the bottom of the inner portion 212 and the bottom of the outer portion 214. In some embodiments, each bottom electrode 210 includes, but not limited to, titanium nitride.

Still referring to FIG. 2, in some embodiments, the second dielectric layer 220 conformally covers the bottom electrode 210. That is, the second dielectric layer 220 has a pattern and/or profile similar to the bottom electrode 210. Specifically, the bottom electrode 210 is completely covered by the second dielectric layer 220. In some embodiments, the second dielectric layer 220 includes, but not limited to, zirconium dioxide.

Reference is still made to FIG. 2. The top electrode 230 covers the second dielectric layer 220, and the top electrode 230 includes a first portion 232 inserted into the bottom electrode 210 and a second portion 234 over the first portion 232. Specifically, the first portion 232 of the top electrode 230 is inserted into the first trench 213 and the second trench 215, and the second portion 234 of the top electrode 230 is over first trench 213, the second trench 215, and the bottom electrode 210. The second dielectric layer 220 may be partially or completely covered by the top electrode 230. In other words, the top electrode 230 and the bottom electrode 210 are separated by the second dielectric layer 220. In some embodiments, the top electrode 230 includes, but not limited to, polysilicon.

In some embodiments, as shown in FIG. 2, the second anti-fuse structure 200 may further includes a supporting structure 240 over the bottom electrode 210. In some embodiments, the supporting structure 240 may include, but not limited to nitride materials, for example, silicon nitride, or silicon oxynitride. The supporting structure 240 can support the bottom electrode 210 to prevent a collapse issue of the bottom electrode 210 caused by its high aspect ratio. The second anti-fuse structure 200 has a width W2 and a height H2. In some embodiments, the width W2 may be smaller than a width W1 of the first anti-fuse structure 100 shown in FIG. 1. In some embodiments, the height H2 of the second anti-fuse structure 200 may be greater than the sum of the T2 and T3 of the first anti-fuse structure 100 shown in FIG. 1. More specifically, a thickness of the sum of the second dielectric layer 220 and the top electrode 230 may be greater than the sum of the first dielectric layer 120 and the conductive layer 130.

Figure 3:
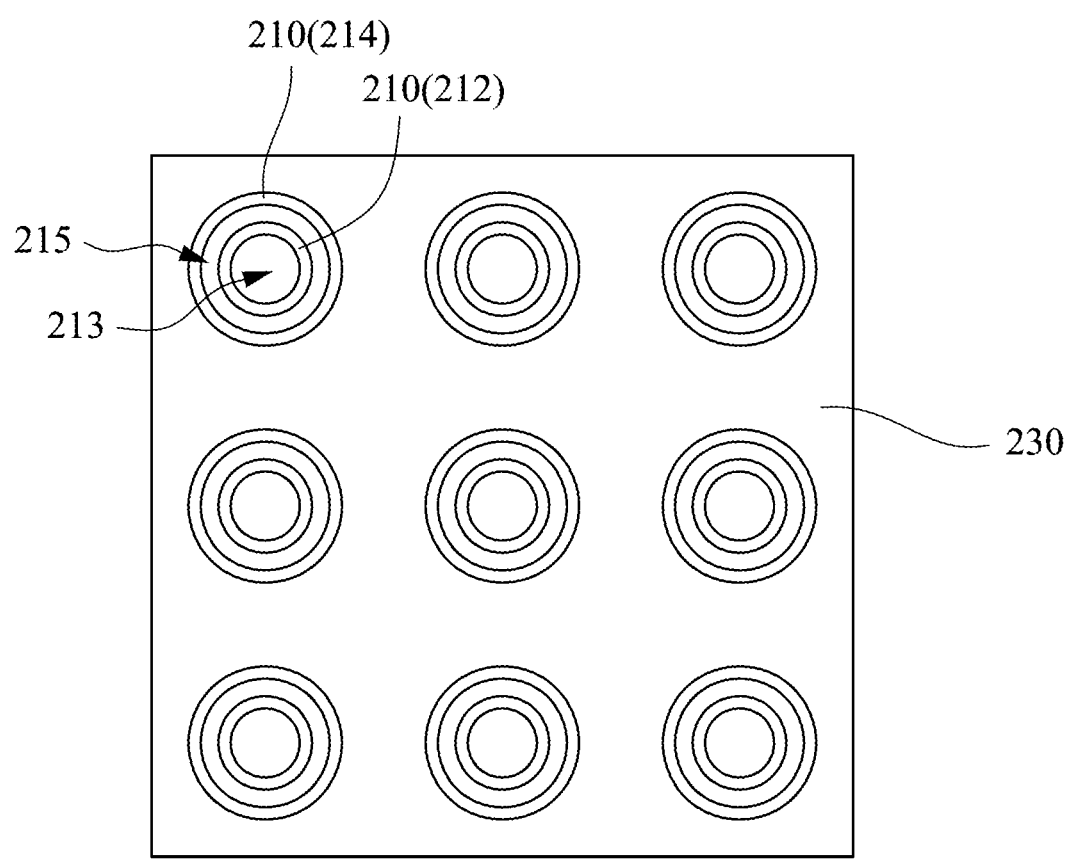
FIG. 3 is a schematic top view of second anti-fuse structure in accordance with various embodiments of this invention.

FIG. 3 is a schematic top view of second anti-fuse structure 200 in accordance with various embodiments of this invention. It is understood that FIG. 3 is a simplified diagram only depicting the top electrode 230 and the bottom electrode 210 in order to clearly show the configuration of the second anti-fuse structure 200. The second dielectric layer 220 conformally covers the bottom electrode 210, and therefore is not depicted in FIG. 3. In some embodiments, the supporting structure 240 shown in FIG. 2 may be positioned among four adjacent bottom electrodes 210. As shown in FIG. 3, in some embodiments, the inner portion 212 and the outer portion 214 collectively constitute a generally concentric circular shape in the top view. In other words, the inner portion 212 and the outer portion 214 of the bottom electrode 210 may have a transverse cross section that is generally concentric circular.

Although FIG. 3 illustrated that the second anti-fuse structure 200 has a 3×3 array of the bottom electrodes 210, it should be understood that the arrangement of the bottom electrodes 210 is not limited thereto. The number and the arrangement of the bottom electrodes 210 can be changed, depending on the need. For example, the second anti-fuse structure 200 may have an 8×5 array of bottom electrodes 210.

Please refer back to FIG. 1. The first metal layer 300 is between the first anti-fuse structure 100 and the second anti-fuse structure 200. In some embodiments, the first metal layer 300 may include tungsten, or other suitable conductive materials. In some embodiments, the first metal layer 300 may be a conductive wire. In some example, the first metal layer 300 may be, but not limited to, a word line of a memory cell such as DRAM cell.

In some embodiments, the semiconductor structure 1000 further includes one or more first contacts 310 and one or more second contacts 320. The first contacts 310 are between the first anti-fuse structure 100 and the first metal layer 300, and the second contacts 320 are between the second anti-fuse structure 200 and the first metal layer 300. Specifically, the conductive layer 130 of the first anti-fuse structure 100 is connected to the first metal layer 300 by the first contact 310, and the junction portion 216 of the second anti-fuse structure 200 is connected to the first metal layer 300 by the second contact 320. In some embodiments, the first contact 310 and the second contact 320 may include any suitable conductive material, such as tungsten, or the like. As shown in FIG. 1, the first contacts 310 may be formed in a first insulating layer 312, such that the first contacts 310 and first insulating layer 312 are formed in a same layer. Similarly, the second contacts 320 may be formed in a second insulating layer 322 such that the second contacts 320 and second insulating layer 322 are formed in a same layer.

In some embodiments, the semiconductor structure 1000 further includes a second metal layer 400 over the second anti-fuse structure 200. More specifically, the second metal layer 400 is directly connected to the second portion 234 of the top electrode 230. In some embodiments, the second metal layer 400 may include tungsten, or other suitable conductive materials. In some embodiments, the second metal layer 400 may be a conductive wire. In examples, the second metal layer 400 may be coupled to another active region different from the active region in which the first anti-fuse structure 100 is located, through the second metal layer 400.

Figure 4:
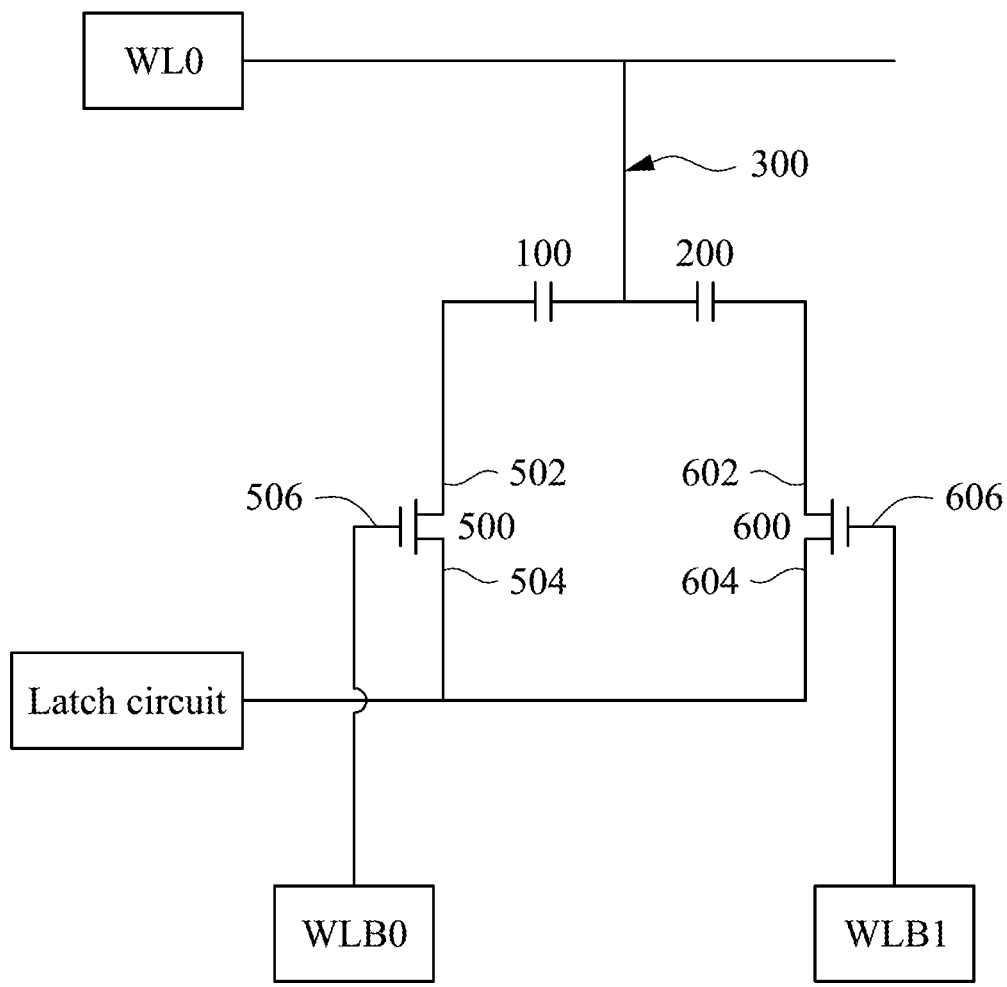
FIG. 4 is a schematic diagram showing a simplified circuit layout of a of semiconductor structure in accordance with various embodiments of this invention.

FIG. 4 is a schematic diagram showing a simplified circuit layout of a semiconductor structure 1000 in accordance with various embodiments of this invention. In some embodiments, the semiconductor structure 1000 further includes a transistor 500 electrically coupled to the first anti-fuse structure 100 and the second anti-fuse structure 200. As shown in FIG. 4, the transistor 500 may be substantially equipotentially coupled to the first anti-fuse structure 100, the second anti-fuse structure 200, and another transistor 600. Specifically, a source/drain electrodes 502, 504 of the transistor 500 may be substantially equipotentially coupled to the first anti-fuse structure 100 and second anti-fuse structure 200. A gate electrode 506 of the transistor 500 may be substantially equipotentially coupled to a word line WLB0. Similarly, a source/drain electrodes 602, 604 of the transistor 600 may be substantially equipotentially coupled to the first anti-fuse structure 100 and second anti-fuse structure 200. A gate electrode 606 of the transistor 600 may be substantially equipotentially coupled to a word line WLB1. The source/drain electrodes of the transistors 500, 600 may be substantially equipotentially coupled to the latch circuit. The first metal layer 300 may be substantially equipotentially coupled to the word line WL0. The circuit with the first anti-fuse structure 100 and the second anti-fuse structure 200 may be a spare circuit to replace or repair a defective circuit of a memory device. More specifically, the first anti-fuse structure 100 can be blown by applying a voltage bias between the semiconductor substrate 110 and the conductive layer 130 that is sufficient to break down the first dielectric layer 120, thereby establishing a conductive path between the transistor 500 and the first metal layer 300. The second anti-fuse structure 200 can be blown by applying a voltage bias between the bottom electrode 210 and the top electrode 230 to break down the second dielectric layer 220, thereby establishing a conductive path between transistor 600 and the first metal layer 300. It is understood that the arrangement of the first anti-fuse structure 100 and the second anti-fuse structure 200 is not limited to FIG. 4, for example, the second anti-fuse structure 200 may be substantially equipotentially coupled to the transistor 500, and the first anti-fuse structure 100 may be substantially equipotentially coupled to the transistor 600.

The semiconductor structure disclosed herein is a novel structure, which include a first anti-fuse structure, a second anti-fuse structure over the first anti-fuse structure, and a first metal layer between thereof. The second anti-fuse structure is stacked over the first anti-fuse structure, and elongated along a longitudinal axis that is perpendicular to a plane of the first anti-fuse structure. The embodiments of the present invention discussed above have advantages over conventional methods, and the advantages are summarized below. A circuit with the first anti-fuse structure and the second anti-fuse structure may be a spare circuit which can repair or replace a defective circuit of a memory device. The semiconductor structure of the present invention can reduce the space that the anti-fuse structures required by stacking the anti-fuse structures vertically instead of horizontally. Therefore, the integration of a semiconductor device may be increased.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
   a first anti-fuse structure;
   a second anti-fuse structure over the first anti-fuse structure, wherein the second anti-fuse structure comprises:
   at least one bottom electrode having an inner portion, an outer portion surrounding the inner portion, and a junction portion under the inner portion and the outer portion, where each of the inner portion and the outer portion is a hollow columnar elongated along a longitudinal axis that is perpendicular to a plane of the first anti-fuse structure, and the junction portion is connected with the inner portion and the outer portion,
   a second dielectric layer conformally covering the bottom electrode, and
   a top electrode covering the second dielectric layer, wherein the top electrode includes a first portion inserted into the bottom electrode and a second portion over the first portion; and
   a first metal layer between the first anti-fuse structure and the second anti-fuse structure.

2. The semiconductor structure of claim 1, wherein the first anti-fuse structure comprises:
   a semiconductor substrate;
   a first dielectric layer on the semiconductor substrate; and
   a conductive layer on the first dielectric layer.

3. The semiconductor structure of claim 2, wherein the semiconductor substrate has a heavily doped region in contact with the first dielectric layer.

4. The semiconductor structure of claim 2, wherein the conductive layer extends on a plane parallel to the semiconductor substrate.

5. The semiconductor structure of claim 4, wherein the inner portion and the outer portion have a generally concentric circular transverse cross section.

6. The semiconductor structure of claim 4, wherein the bottom electrode comprises titanium nitride.

7. The semiconductor structure of claim 4, wherein the second dielectric layer comprises zirconium dioxide.

8. The semiconductor structure of claim 4, wherein the top electrode comprises polysilicon.

9. The semiconductor structure of claim 4, further comprising a supporting structure over the bottom electrode, wherein the supporting structure includes nitride.

10. The semiconductor structure of claim 1, further comprising:
    a first contact between the first anti-fuse structure and the first metal layer; and
    a second contact between the second anti-fuse structure and the first metal layer.

11. The semiconductor structure of claim 1, further comprising a second metal layer over the second anti-fuse structure.

12. The semiconductor structure of claim 1, further comprising a transistor coupled to the first anti-fuse structure and the second anti-fuse structure.

* * * * *